United States Patent
Peng et al.

(10) Patent No.: US 8,797,751 B2
(45) Date of Patent: Aug. 5, 2014

(54) POWER DISTRIBUTION UNIT AND SERVER CABINET WITH THE POWER DISTRIBUTION UNIT

(75) Inventors: Wen-Tang Peng, New Taipei (TW); Xiao-Zheng Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 166 days.

(21) Appl. No.: 13/525,388

(22) Filed: Jun. 18, 2012

(65) Prior Publication Data

US 2013/0314848 A1 Nov. 28, 2013

(30) Foreign Application Priority Data

May 28, 2012 (CN) .......................... 2012 1 0168279

(51) Int. Cl.
*H05K 5/00* (2006.01)

(52) U.S. Cl.
USPC ...... 361/754; 361/679.02; 361/725; 361/796; 361/807; 174/50; 174/50.52; 174/535

(58) Field of Classification Search
USPC ............ 361/601–602, 622, 627, 641, 679.02, 361/725, 752, 754, 796, 801–802, 807
See application file for complete search history.

(56) References Cited

U.S. PATENT DOCUMENTS

| | | | |
|---|---|---|---|
| 5,784,249 A * | 7/1998 | Pouliot .......................... | 361/622 |
| 6,769,551 B2 * | 8/2004 | Rafferty et al. .................. | 211/26 |
| 7,535,696 B2 * | 5/2009 | Ewing et al. .................. | 361/622 |
| 7,542,268 B2 * | 6/2009 | Johnson, Jr. .................. | 361/622 |
| 7,990,689 B2 * | 8/2011 | Ewing et al. .................. | 361/622 |
| 2005/0094357 A1 * | 5/2005 | Ewing et al. .................. | 361/626 |
| 2005/0101193 A1 * | 5/2005 | Godard .......................... | 439/652 |
| 2012/0081842 A1 * | 4/2012 | Ewing et al. .................. | 361/622 |
| 2013/0188309 A1 * | 7/2013 | Ross ......................... | 361/679.48 |

* cited by examiner

*Primary Examiner* — Courtney Smith
(74) *Attorney, Agent, or Firm* — Novak Druce Connolly Bove + Quigg LLP

(57) ABSTRACT

A server cabinet includes a housing and a power distribution unit (PDU). The housing includes a bottom plate defining two first holes, and a top plate defining two second holes. The PDU includes a main body, a top base, a motion member, a resilient member, and a handle. Two first pins protrude down from the main body to be inserted into the first holes. The top base is fastened to the main body. A top of the top base defines two through holes. The motion member is movably received in the top base, and forms two second pins. The resilient member is connected between the main body and the motion member, to bias the motion member to move up, thereby allowing the second pins to extend out of the corresponding through holes and be inserted into the second holes. The handle is attached to the motion member.

12 Claims, 4 Drawing Sheets

POWER DISTRIBUTION UNIT AND SERVER CABINET WITH THE POWER DISTRIBUTION UNIT

BACKGROUND

1. Technical Field

The present disclosure relates to a server cabinet having a power distribution unit (PDU).

2. Description of Related Art

A PDU of a server cabinet is generally screwed to a side of the housing of the cabinet. Mounting the PDU requires the use of a tool, such as a screwdriver, which is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
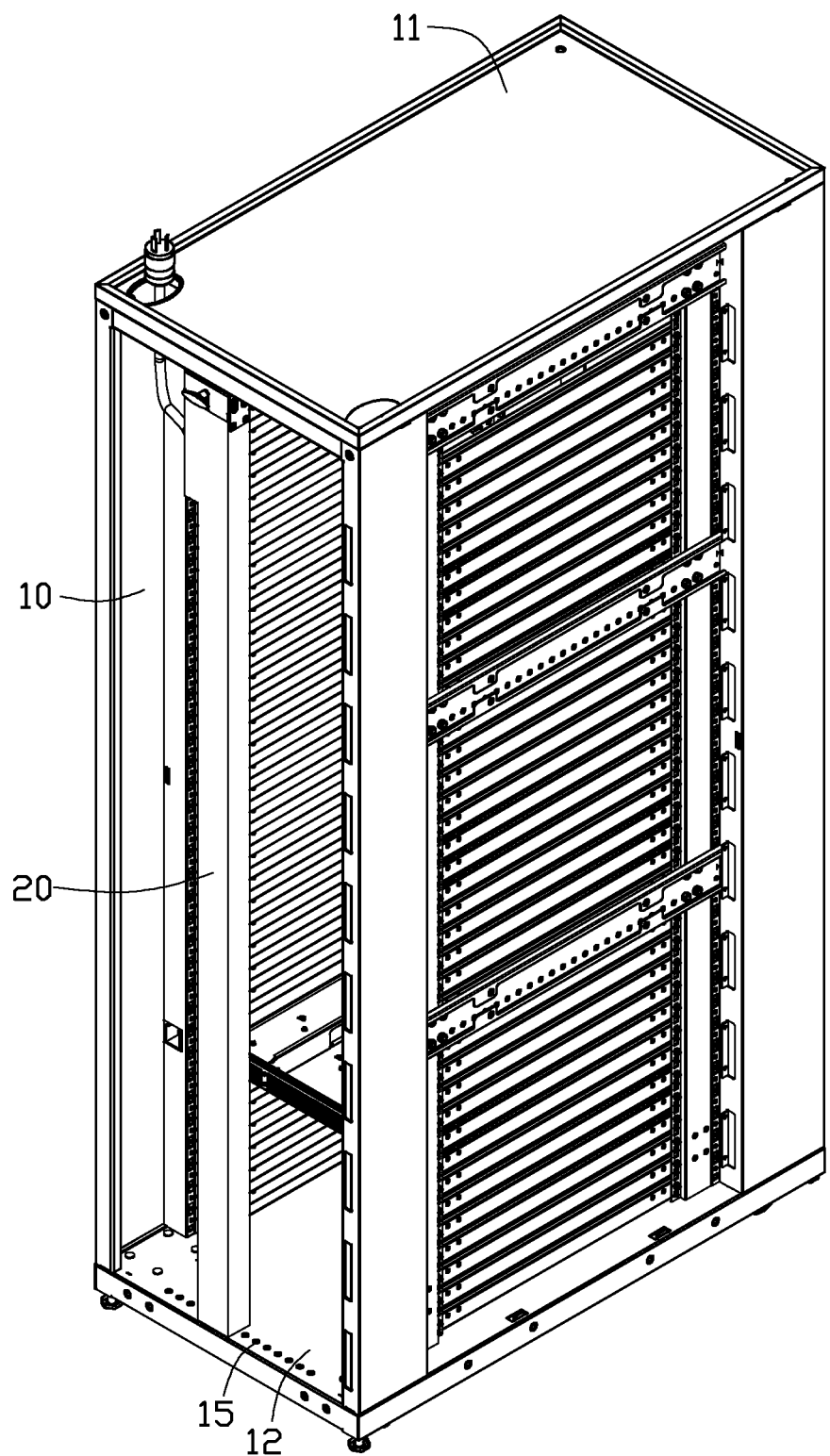
FIG. 1 is an assembled, isometric view of an exemplary embodiment of a server cabinet, wherein the cabinet includes a power distribution unit (PDU).
Figure 2:
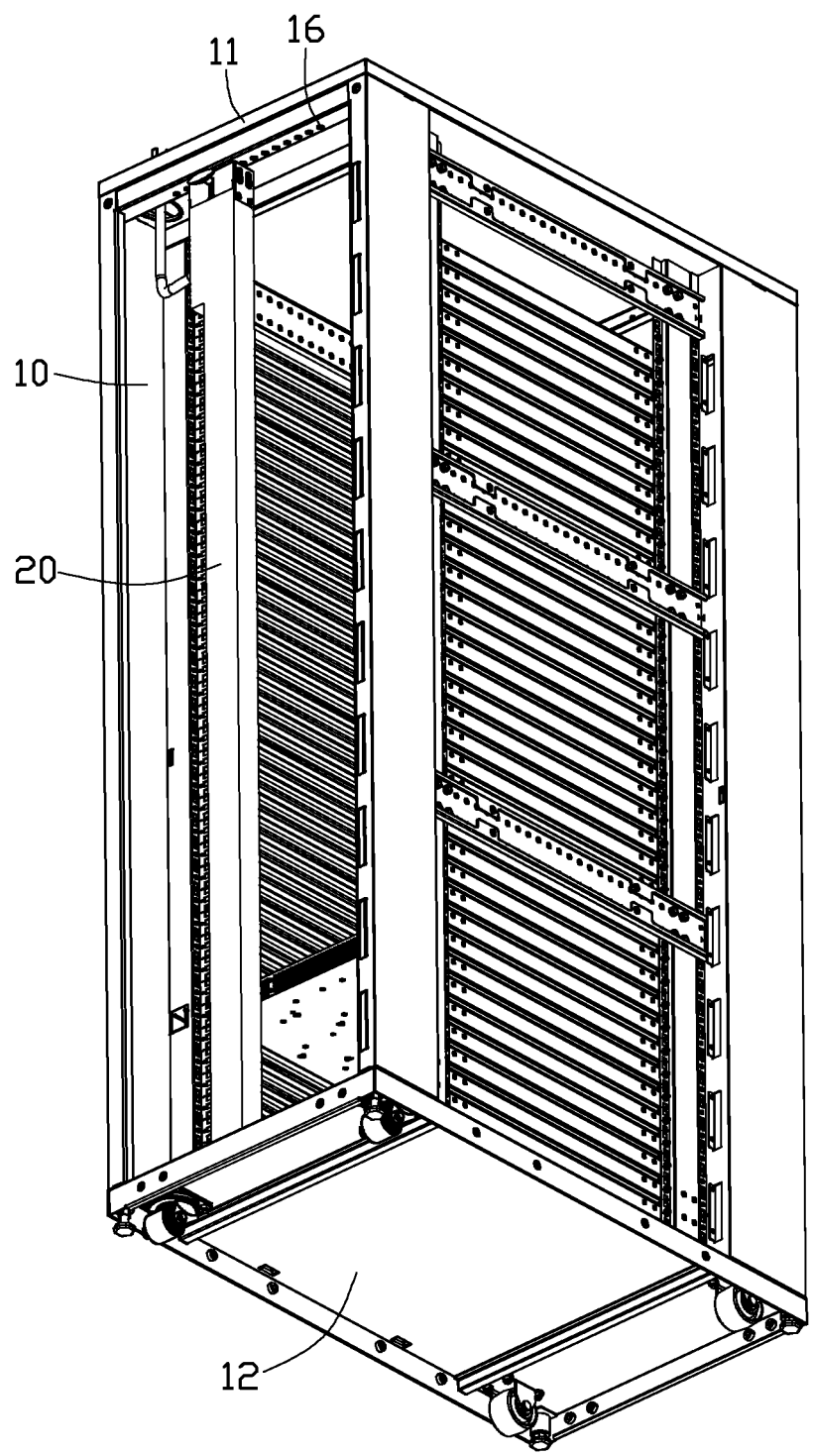
FIG. 2 is similar to FIG. 1, but viewed from a different perspective.

FIGS. 1 and 2 show an exemplary embodiment of a server cabinet including a housing 10 and a power distribution unit (PDU) 20.

The housing 10 includes a top plate 11 and a bottom plate 12. A row of first holes 15 is defined in the bottom plate 12. A row of second holes 16 is defined in the top plate 11, aligning with the corresponding first holes 15.

Figure 3:
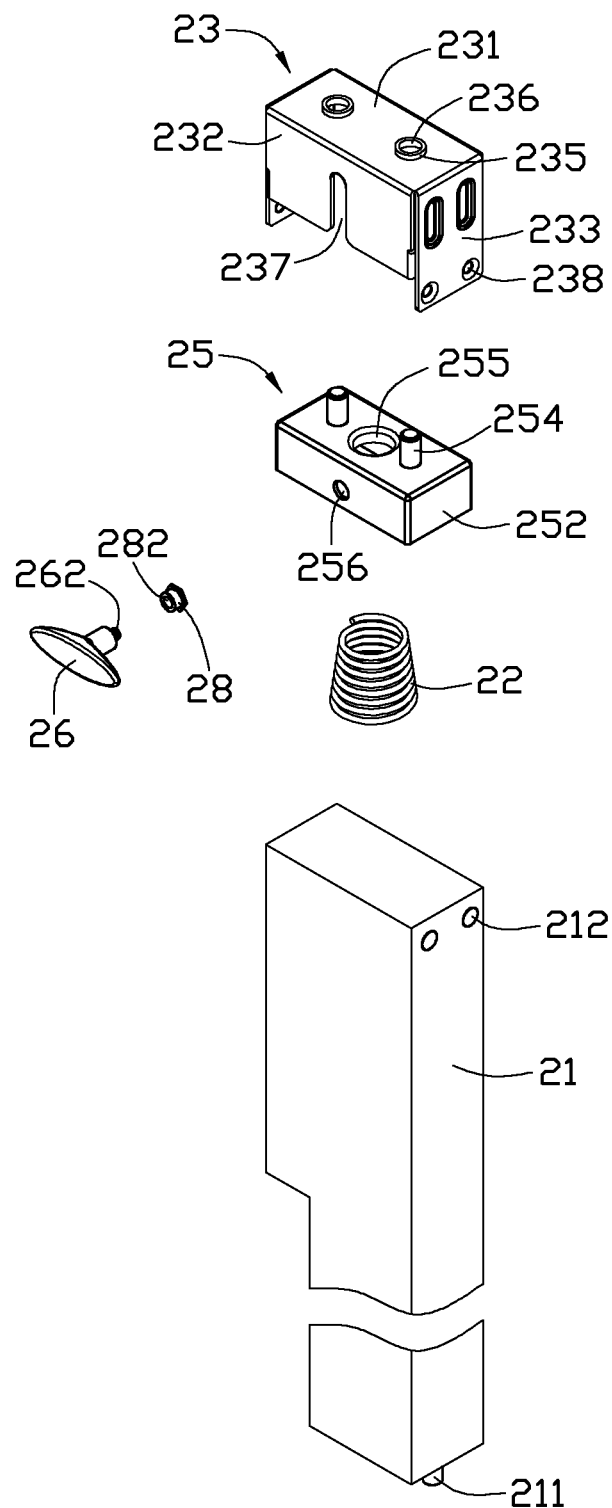
FIG. 3 is an exploded, isometric view of the PDU of FIG. 1.

FIG. 3 shows the PDU 20 including a main body 21, a resilient member 22, a top base 23, a motion member 25, a handle 26 with a stud 262, and a rivet 28 defining a screw hole 282. In the embodiment, the resilient member 22 is a spring.

Two pins 211 protrude from a bottom surface of the main body 21. Two mounting holes 212 are defined in a top end of each of left and right sides of the main body 21.

The top base 23 includes a rectangular top wall 231, two sidewalls 232 respectively perpendicularly extending down from opposite sides of the top wall 231, and two end walls 233 respectively perpendicularly extending down from opposite ends of the top wall 231. Two protrusions 235 protrude up from the top wall 231. A through hole 236 is defined in a top surface of each protrusion 235, extending through the top wall 231. An opening 237 is defined in one of the sidewalls 232, extending through a bottom of the sidewall 232. Two through holes 238 are defined in a bottom end of each end wall 233.

The motion member 25 includes a rectangular and hollow base body 252 without a bottom wall. Two pins 254 protrude up from a top of the base body 252. A ring 255 extends down from a middle of the top of the base body 252. A through hole 256 is defined in a side of the base body 252.

Figure 4:
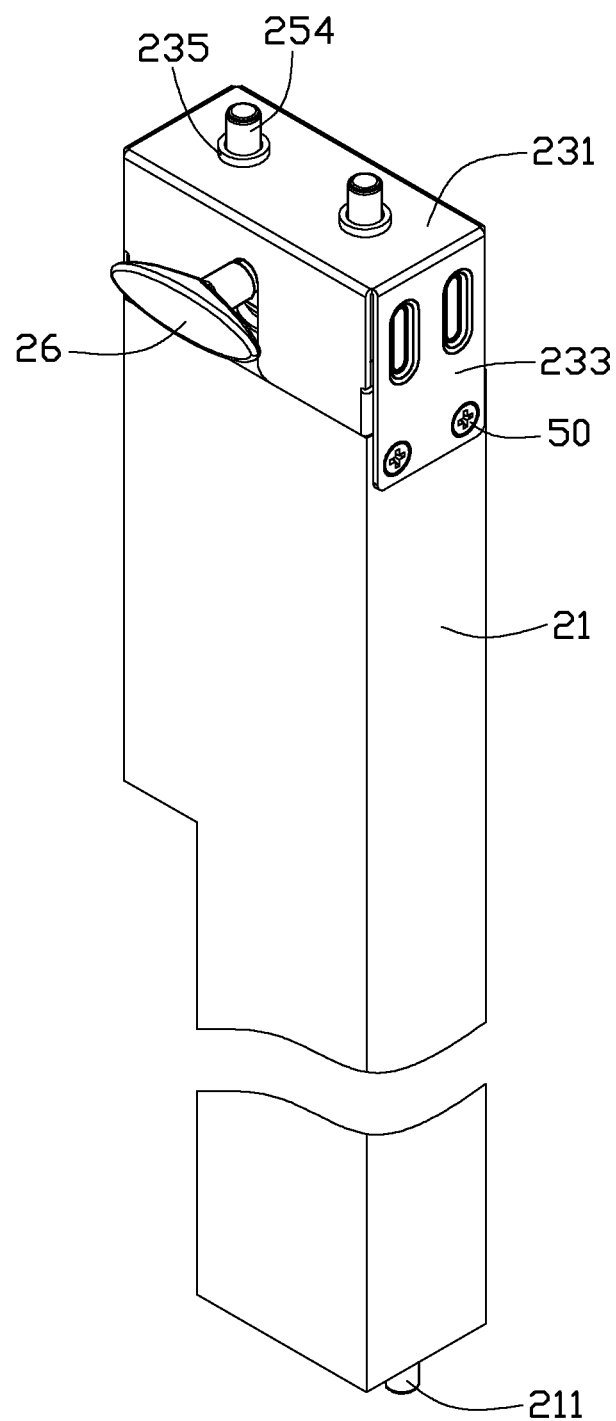
FIG. 4 is an assembled, isometric view of FIG. 3.

FIG. 4 shows the assembly of the PDU 20. The rivet 28 is riveted to the through hole 256. A top end of the resilient member 22 is placed around the ring 255 from a bottom of the base body 252. The top base 23 is placed above the motion member 25 and manipulated toward the motion member 25. The pins 254 respectively extend through the through holes 236. The base body 252 abuts against the top wall 231. The rivet 28 is located at a top end of the opening 237. A bottom end of the resilient member 22 is placed on a top surface of the main body 21. The top base 23 is manipulated, to allow the through holes 238 to align with the corresponding mounting holes 212. Four screws 50 extend through the through holes 238, and engage in the mounting holes 212. The stud 262 engages in the screw hole 282, to fasten the handle 26 to the motion member 25. Therefore, the PDU 20 is assembled.

FIGS. 1 and 2 show the assembly of the server cabinet. The handle 26 is pulled down, to make the motion member 25 move down. The pins 254 retract into the top base 23. The resilient member 22 is compressed. The PDU 20 is leaned, to engage the pins 211 in two of the first holes 15. The PDU 20 is manipulated to be upright. The top base 23 abuts against a bottom of the top plate 11. The through holes 236 respectively align with two corresponding second holes 16. The handle 26 is released, and the resilient member 22 is restored to bias the motion member 25 to move up. The pins 254 extend out of the through holes 236, and engage in the corresponding second holes 16. Therefore, the server cabinet is assembled.

The purpose of defining a plurality of first holes 15 and a plurality of second holes 16 is to flexibly mount the PDU 20, as the size of the PDU 20 and the requirement of mounting.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A power distribution unit (PDU), comprising:
   a main body, two first pins protruding from a bottom surface of the main body;
   a top base fastened to a top of the main body, a top of the top base defining two first through holes, a side of the top base defining an opening;
   a motion member movably received in the top base, two second pins formed on a top of the motion member;
   a resilient member connected between the main body and the motion member, to bias the motion member to move up, thereby allowing the second pins to extend out of the corresponding first through holes; and
   a handle extending through the opening to be attached to the motion member.

2. The PDU of claim 1, wherein the top base comprises a top wall, two sidewalls respectively extending down from opposite sides of the top wall, and two end walls respectively extending down from opposite ends of the top wall, lower portions of the end walls are fastened to opposite sides of the main body, the opening is defined in one of the sidewalls.

3. The PDU of claim 2, wherein two protrusions protrude up from the top wall, the first through holes are respectively defined in the protrusions, extending through the top wall.

4. The PDU of claim 1, wherein the motion member comprises a hollow base body, the second pins protrude from a top of the base body, a ring extends down from the top of the base body, the resilient member is a spring, a top end of the resilient member is placed around the ring.

5. The PDU of claim 4, wherein a bottom end of the resilient member extends through a bottom of the base body to abut against the top of the main body.

6. The PDU of claim 4, wherein a second through hole is defined in a side of the motion member facing the opening, a rivet defining a screw hole is riveted to the second through hole, a stud is formed on the handle to engage in the screw hole.

7. A server cabinet, comprising:
   a housing comprising a bottom plate defining a row of first holes, and a top plate defining a row of second holes, the second holes aligning with the corresponding first holes; and
   a power distribution unit (PDU), comprising:
      a main body, two first pins protruding from a bottom surface of the main body to engage in two of the first holes;
      a top base fastened to a top of the main body, a top of the top base defining two first through holes, a side of the top base defining an opening;
      a motion member movably received in the top base, two second pins formed on a top of the motion member;
      a resilient member connected between the main body and the motion member, to bias the motion member to move up, thereby allowing the second pins to extend out of the corresponding first through holes and engage in two corresponding second holes; and
      a handle extending through the opening to be attached to the motion member.

8. The server cabinet of claim 7, wherein the top base comprises a top wall, two sidewalls respectively extending down from opposite sides of the top wall, and two end walls respectively extending down from opposite ends of the top wall, lower portions of the end walls are fastened to opposite sides of the main body, the opening is defined in one of the sidewalls.

9. The server cabinet of claim 8, wherein two protrusions protrude up from the top wall, the first through holes are respectively defined in the protrusions, extending through the top wall.

10. The server cabinet of claim 7, wherein the motion member comprises a hollow base body, the second pins protrude from a top of the base body, a ring extends down from the top of the base body, the resilient member is a spring, a top end of the resilient member is placed around the ring.

11. The server cabinet of claim 10, wherein a bottom end of the resilient member extends through a bottom of the base body to abut against the top of the main body.

12. The server cabinet of claim 10, wherein a second through hole is defined in a side of the motion member facing the opening, a rivet defining a screw hole is riveted to the second through hole, a stud is formed on the handle to engage in the screw hole.

* * * * *